(12) United States Patent
Balakrishnan et al.

(10) Patent No.: US 9,837,414 B1
(45) Date of Patent: Dec. 5, 2017

(54) STACKED COMPLEMENTARY FETS FEATURING VERTICALLY STACKED HORIZONTAL NANOWIRES

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/338,515

(22) Filed: Oct. 31, 2016

(51) Int. Cl.
*H01L 27/092* (2006.01)
*H01L 29/10* (2006.01)
(Continued)

(52) U.S. Cl.
CPC .... *H01L 27/0921* (2013.01); *H01L 21/76805* (2013.01); *H01L 21/76843* (2013.01);
(Continued)

(58) Field of Classification Search
CPC ........... H01L 27/0921; H01L 21/76805; H01L 21/76843; H01L 21/76895;
(Continued)

(56) References Cited

U.S. PATENT DOCUMENTS

| 8,383,512 | B2* | 2/2013 | Chen | ............... | H01L 23/50 257/E21.159 |
| 8,541,819 | B1* | 9/2013 | Or-Bach | ............ | H01L 29/7841 257/211 |

(Continued)

OTHER PUBLICATIONS

K. Cheng et al., "Dual Work Function Integration for Stacked Finfet," U.S. Appl. No. 14/708,885, filed May 11, 2015, 57 pages.
(Continued)

*Primary Examiner* — Nathan W Ha
(74) *Attorney, Agent, or Firm* — Scully, Scott, Murphy & Presser, P.C.; Louis J. Percello, Esq.

(57) ABSTRACT

After forming a stacked nanowire CMOS device including a first stacked nanowire array laterally surrounded by first epitaxial semiconductor regions, a second stacked nanowire array overlying the first stacked nanowire array and laterally surrounded by second epitaxial semiconductor regions, and a functional gate structure straddling over each semiconductor nanowire in the first and second stacked nanowire arrays, a common source/drain contact structure is formed on one side of the functional gate structure contacting one of the first epitaxial semiconductor regions and one of the second epitaxial semiconductor regions. A first local source/drain contact structure is formed on the opposite side of the functional gate structure contacting another of the first epitaxial semiconductor regions. After forming a trench isolation structure over the first local source/drain contact structure, a second local source/drain structure is formed overlying the first source/drain local contact structure and
(Continued)

contacting another of the second epitaxial semiconductor regions.

20 Claims, 17 Drawing Sheets

(51) Int. Cl.
| | |
|---|---|
| H01L 29/06 | (2006.01) |
| H01L 29/423 | (2006.01) |
| H01L 29/786 | (2006.01) |
| H01L 21/8238 | (2006.01) |
| H01L 21/768 | (2006.01) |
| H01L 29/66 | (2006.01) |

(52) U.S. Cl.
CPC ........ *H01L 21/76895* (2013.01); *H01L 21/823807* (2013.01); *H01L 21/823871* (2013.01); *H01L 21/823878* (2013.01); *H01L 21/823892* (2013.01); *H01L 29/0653* (2013.01); *H01L 29/0673* (2013.01); *H01L 29/1083* (2013.01); *H01L 29/42392* (2013.01); *H01L 29/66545* (2013.01); *H01L 29/78618* (2013.01); *H01L 29/78696* (2013.01); *H01L 2029/42388* (2013.01)

(58) Field of Classification Search
CPC ....... H01L 21/823807; H01L 21/82378; H01L 29/0653; H01L 29/0673
See application file for complete search history.

(56) References Cited

U.S. PATENT DOCUMENTS

| | | | |
|---|---|---|---|
| 8,598,032 B2* | 12/2013 | Chen | ................. H01L 27/11286 257/E23.169 |
| 8,970,040 B1* | 3/2015 | Chen | ................. H01L 21/76838 257/211 |
| 9,070,447 B2* | 6/2015 | Chen | ................... H01L 27/1157 |
| 9,412,840 B1* | 8/2016 | Leobandung | ..... H01L 29/66545 |
| 9,437,501 B1* | 9/2016 | Cheng | ................... H01L 27/092 |
| 2014/0151638 A1* | 6/2014 | Chang | ............... H01L 29/42392 257/27 |
| 2015/0372115 A1* | 12/2015 | Koh | .................... H01L 29/6656 438/301 |
| 2015/0372145 A1* | 12/2015 | Cheng | ................. H01L 29/1033 257/288 |
| 2016/0268158 A1* | 9/2016 | Leobandung | ....... H01L 21/7682 |

OTHER PUBLICATIONS

K. Cheng et al., "Method and Structure of Stacked Finfet," U.S. Appl. No. 14/936,069, filed Nov. 9, 2015, 34 pages.
K. Cheng et al., "Contact Formation to 3D Monolithic Stacked Finfets," U.S. Appl. No. 14/753,908, filed Jun. 29, 2015, 36 pages.

* cited by examiner

STACKED COMPLEMENTARY FETS FEATURING VERTICALLY STACKED HORIZONTAL NANOWIRES

BACKGROUND

The present application relates to the fabrication of semiconductor devices, and more particularly to the formation of a stacked nanowire complementary metal oxide semiconductor (CMOS) device.

The use of non-planar semiconductor devices such as, for example, semiconductor nanowire field effect transistors (FETs) is the next step in the evolution of complementary metal oxide semiconductor (CMOS) devices. Semiconductor nanowire FETs can achieve higher drive currents with increasingly smaller dimensions as compared to conventional planar FETs.

Three-dimensional (3D) monolithic integration by stacking one type of FETs (e.g., p-type FETs) on top of a complementary type of FETs (e.g., n-type FETs) is an attractive approach for 5 nm node technology and beyond. FET stacking combined with nanowire technology can benefit from device electrostatics control in addition to area scaling. Despite the above advantages in 3D monolithic integration, FET stacking approaches usually require complicated fabrication processes. In addition, such vertical device architecture also makes the formation of contact structures for the vertically stacked FETs very difficult. There remains a challenge in forming 3D stacked transistors as well as contact structures to such 3D stacked transistors.

SUMMARY

The present application provides a method for forming 3D stacked nanowire FETs and contact structures for such vertically stacked nanowire FETs. After forming a stacked nanowire CMOS device including a first stacked nanowire array laterally surrounded by first epitaxial semiconductor regions, a second stacked nanowire array overlying the first stacked nanowire array and laterally surrounded by second epitaxial semiconductor regions, and a functional gate structure straddling over each semiconductor nanowire in the first and second stacked nanowire arrays, a common source/drain contact structure is formed on one side of the functional gate structure contacting one of the first epitaxial semiconductor regions and one of the second epitaxial semiconductor regions. A first local source/drain contact structure is formed on the opposite side of the functional gate structure contacting another of the first epitaxial semiconductor regions. After forming a trench isolation structure over the first local source/drain contact structure, a second local source/drain structure is formed overlying the first source/drain local contact structure and contacting another of the second epitaxial semiconductor regions.

In one aspect of the present application, a semiconductor structure is provided. The semiconductor structure includes a plurality of vertically stacked and vertically spaced apart semiconductor nanowires located over a substrate. The plurality of vertically stacked and vertically spaced apart semiconductor nanowires are organized into a lower nanowire array and an upper nanowire array. The semiconductor structure also includes a functional gate structure straddling over the plurality of vertically stacked and vertically spaced apart semiconductor nanowires, first epitaxial semiconductor regions of a first conductivity type laterally contacting end walls of the semiconductor nanowires in the lower nanowire array, second epitaxial semiconductor regions of a second conductivity type opposite the first conductivity type laterally contacting end walls of the semiconductor nanowires in the upper nanowire array, and an insulator layer located between the first epitaxial semiconductor region and the second epitaxial semiconductor regions.

In another aspect of the present application, a method of forming a semiconductor structure is provided. The method of the present application includes providing a fin stack including alternating sacrificial fins and semiconductor fins over a substrate. After forming a sacrificial gate structure straddling over a portion of the fin stack, portions of the fin stack that are not covered by the sacrificial gate structure are removed to provide a fin stack portion including alternating sacrificial fin portions and semiconductor fin portions. First epitaxial semiconductor regions of a first conductivity type are formed on end walls of a lower fin sub-stack portion in the sacrificial fin stack portion. An insulator layer is then formed on the substrate to cover the first epitaxial semiconductor regions. Next, second epitaxial semiconductor regions of a second conductivity type opposite the first conductivity type are formed on end walls of an upper fin sub-stack portion in the sacrificial fin stack portion. After forming an interlevel dielectric (ILD) layer on the second epitaxial semiconductor regions and the insulator layer, a sacrificial gate stack in the sacrificial gate structure is removed to provide a gate cavity exposing the fin stack portion. Sacrificial fin portions in the fin stack portion are removed such that a gap is provided beneath each of the semiconductor fin portion. Next, a functional gate stack is formed within the gate cavity and each gap.

DETAILED DESCRIPTION

Figure 1A:
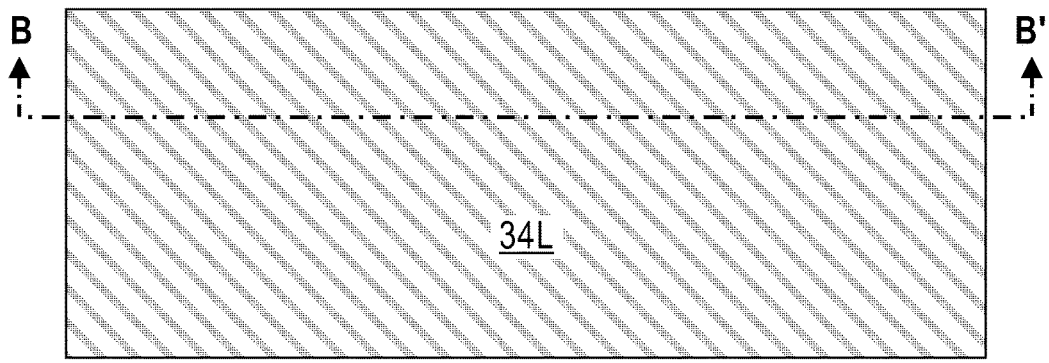
FIG. 1A is a top view of an exemplary semiconductor structure including a semiconductor substrate, a doped semiconductor punch through stop (PTS) layer, and a semiconductor material stack of alternating sacrificial material layers and semiconductor material layers according to an embodiment of the present application.

The present application, which provides a semiconductor nanowire field effect transistor and a method of forming the same, will now be described in greater detail by referring to the following discussion and drawings that accompany the present application. It is noted that the drawings of the present application are provided for illustrative purposes and, as such, they are not drawn to scale. In the drawings and the description that follows, like elements are referred to by like reference numerals. For purposes of the description hereinafter, the terms "upper", "lower", "right", "left", "vertical", "horizontal", "top", "bottom", and derivatives thereof shall relate to the components, layers and/or elements as oriented in the drawing figures which accompany the present application.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

Figure 1B:
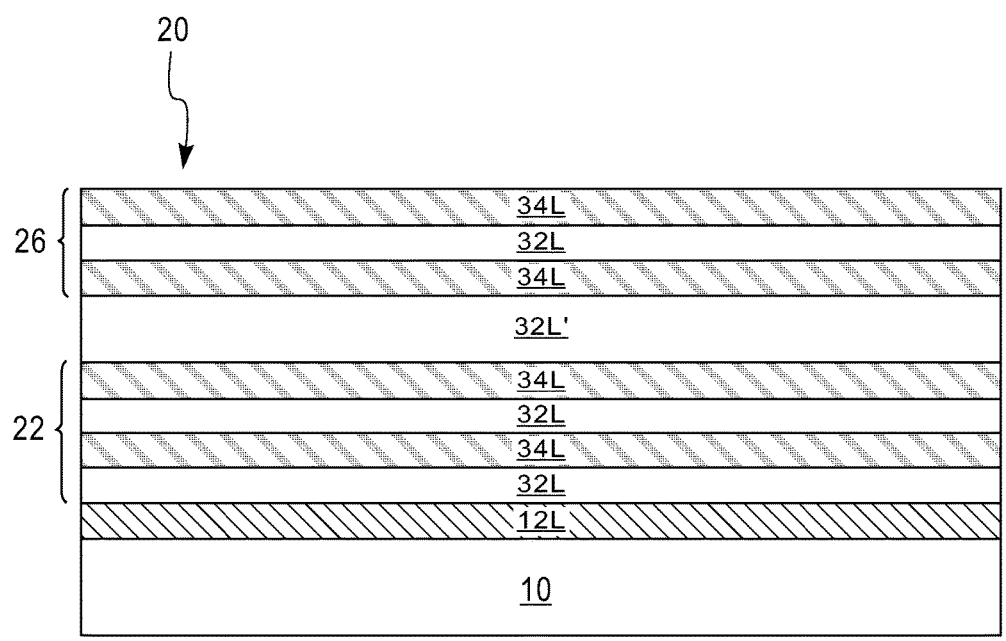
FIG. 1B is a cross-section view of the exemplary semiconductor structure of FIG. 1A along line B-B' of FIG. 1A.

Reference to FIGS. 1A and 1B, an exemplary semiconductor structure according to an embodiment of the present application includes, from bottom to top, a semiconductor substrate 10, a doped semiconductor punch through stop (PTS) layer 12L, and a semiconductor material stack 20. In some embodiments of the present application, the PTS doping layer 12L is omitted and the semiconductor material stack 20 is formed directly on an exposed surface of semiconductor substrate 10.

The semiconductor substrate 10 can be an uppermost portion of a bulk semiconductor substrate or a topmost semiconductor material layer of a semiconductor-on-insulator (SOI) substrate. The semiconductor substrate 10 may include any semiconductor material including, for example, Si, Ge, SiGe, SiC, SiGeC, InAs, InP, InAsP, GaAs, and all other III-V or II-VI compound semiconductors. In one embodiment of the present application, the semiconductor substrate 10 is composed of silicon. The semiconductor material that provides the semiconductor substrate 10 is typically a single crystalline semiconductor such as, for example, single crystalline silicon. The semiconductor substrate 10 can be intrinsic, or can be doped with p-type dopants or n-type dopants. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. If doped, the semiconductor substrate 10 can have a dopant concentration in a range from $1.0 \times 10^{14}$ atoms/cm$^3$ to $1.0 \times 10^{17}$ atoms/cm$^3$, although lesser and greater dopant concentrations can also be employed. In one embodiment, the semiconductor substrate 10 is non-doped.

The doped semiconductor PTS layer 12L, if present, may include any semiconductor material as mentioned above for the semiconductor substrate 10. In one embodiment of the present application, the doped semiconductor PTS layer 12L includes a same semiconductor material as the semiconductor material that provides the semiconductor substrate 10. For example, both the doped semiconductor PTS layer 12L and the semiconductor substrate 10 may be composed of silicon. In another embodiment of the present application, the doped semiconductor PTS layer 12L includes a different semiconductor material than the semiconductor material that provides the semiconductor substrate 10. For example, the doped semiconductor PTS layer 12L may be composed of SiGe and the semiconductor substrate 10 may be composed of silicon.

The doped semiconductor PTS layer 12L has a p-type doping or an n-type doping. The portion of the semiconductor substrate 10 underlying the doped semiconductor PTS layer 12L can be intrinsic, or can have a doping of the same or different conductivity type as the doping of the doped semiconductor PTS layer 12L. The dopant concentration of the doped semiconductor PTS layer 12L can be greater than the dopant concentration of the semiconductor substrate 10, and can be from $1 \times 10^{18}$ atoms/cm$^3$ to $1 \times 10^{19}$ atoms/cm$^3$, although lesser and greater dopant concentrations can also be employed. The doped semiconductor PTS layer 12L can have a thickness from 30 nm to 60 nm, although lesser and greater thicknesses can also be employed.

In some embodiments of the present application, the doped semiconductor PTS layer 12L can be formed by introducing p-type or n-type dopants into an upper portion of the semiconductor substrate using ion implantation or gas phase doping. In other embodiments of the present application, the doped semiconductor PTS layer 12L can be formed utilizing an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, the doped semiconductor PTS layer 12L has an epitaxial relationship, i.e., same crystal orientation, as that of the underlying semiconductor substrate 10.

Examples of various epitaxial growth processes that are suitable for use in forming the doped semiconductor PTS layer 12L include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of the semiconductor material that provides the doped semiconductor PTS layer 12L. In some embodiments, the source gas for the deposition of the semiconductor material that provides the doped semiconductor PTS layer 12L includes a silicon source gas, a germanium source gas or a mixture of a silicon containing gas source and a germanium containing gas source. Carrier gases like hydrogen, nitrogen, helium and argon can be used.

In some embodiments, the dopants can be introduced during the epitaxial growth of the semiconductor material that provides the doped semiconductor PTS layer 12L. In other embodiments, the dopants can be introduced into the semiconductor material that provides the doped semiconductor PTS layer 12L after epitaxial growth, for example, by ion implantation.

The semiconductor material stack 20 includes alternatively stacked sacrificial material layers 32L and semiconductor material layers 34L with a topmost layer being a semiconductor material layer 34L. In one embodiment and as shown in FIG. 1B, the bottommost layer of the semiconductor material stack 20 is a sacrificial material layer 32L. In another embodiment, the bottommost layer of the semiconductor material stack 20 can be a semiconductor material layer 34L (not shown). Although the drawings illustrates a semiconductor material stack containing four sacrificial material layers 32L and four semiconductor material layers 34L, the present application is not limited to that number of layers for the semiconductor material stack. Instead, the present application can employed a semiconductor material stack including any even number of semiconductor material layer 34L separated from one another by sacrificial material layers 32L.

The semiconductor material stack 20 can be divided into a first sub-stack 22 for formation of bottom nanowire FETs of a first conductivity type and a second sub-stack 26 overlying the first sub-stack 22 for formation of top nanowire FETs of a second conductivity type opposite the first conductivity type. In one embodiment, the first conductivity type is n-type, and the second conductivity type is p-type, and vice versa. Each of the first sub-stack 22 and the second sub-stack 24 contains a same number of the semiconductor material layers 34L. In one embodiment and as shown, each of the first sub-stack 22 and the second sub-stack includes two semiconductor material layers 34L separated from each other by a sacrificial material layer 32L. The lower sub-stack 22 is separated from the upper sub-stack 26 by one of the sacrificial material layers having a greater thickness than the other sacrificial material layers 32L. The sacrificial material layer that is located between the first sub-stack 22 and the second sub-stack is herein referred to as an inter-stack sacrificial material layer 32L'.

Each of the sacrificial material layers 32L, 32L' may include any semiconductor material that can be removed selective to a semiconductor material that provides the semiconductor material layers 34L. For example, when the sacrificial material layers 32L, 32L' are composed of SiGe, the semiconductor material layers 34L may be composed of Si. Each of the sacrificial material layers 32L and the semiconductor material layers 34L in the sub-stacks 22, 26 can have a thickness ranging from 5 nm to 20 nm, although lesser and greater thicknesses can also be employed. The inter-stack sacrificial material layer 32L' is typically formed to have a thickness greater than the thickness of the semiconductor material layer(s) 34L and/or sacrificial material layers 32L in the sub-stacks 22, 26. For example, the inter-stack sacrificial material layer 32L' can have a thickness ranging from 10 nm to 50 nm, although lesser and greater thicknesses can also be employed.

Each of the sacrificial material layers 32L, the inter-stack sacrificial material layer 32L' and the semiconductor material layers 34L in the semiconductor material stack 20 may be formed by depositing the appropriate material using an epitaxial growth process described above in forming the doped semiconductor PTS layer 12L. For example, layers of the semiconductor material stack 20 may be formed by CVD or MBE. Each of the sacrificial material layers 32L, the inter-stack sacrificial material layer 32L' and the semiconductor material layers 34L thus formed has a same crystalline orientation as that of an underlying material layer.

In some embodiments of the present application, the epitaxial growth of the various layers of semiconductor material stack 20 may be performed without breaking vacuum between the various depositions. Similarly, the epitaxial growth of the and the doped semiconductor PTS layer 12L and the various layers of the semiconductor material stack 20 can be performed without breaking vacuum between the various depositions. In another embodiment of the present application, the vacuum may be broken between any of the various depositions.

Figure 2A:
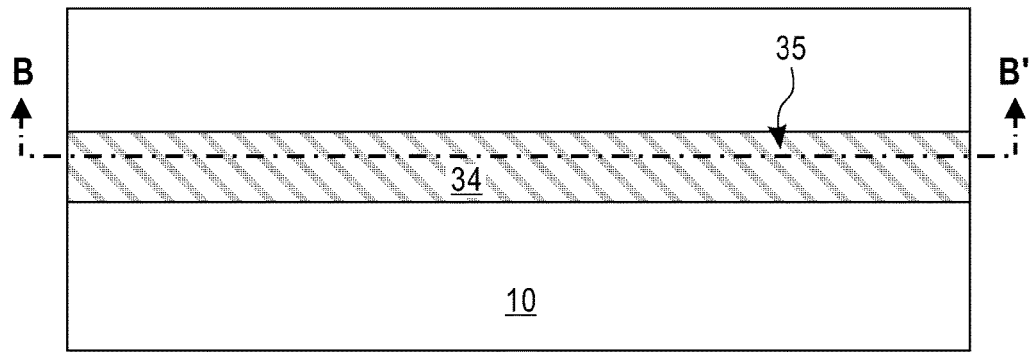
FIG. 2A is a top view of the exemplary semiconductor structure of FIGS. 1A-1B after patterning the semiconductor material stack and the doped semiconductor PTS layer to form at least one fin stack.
Figure 2B:
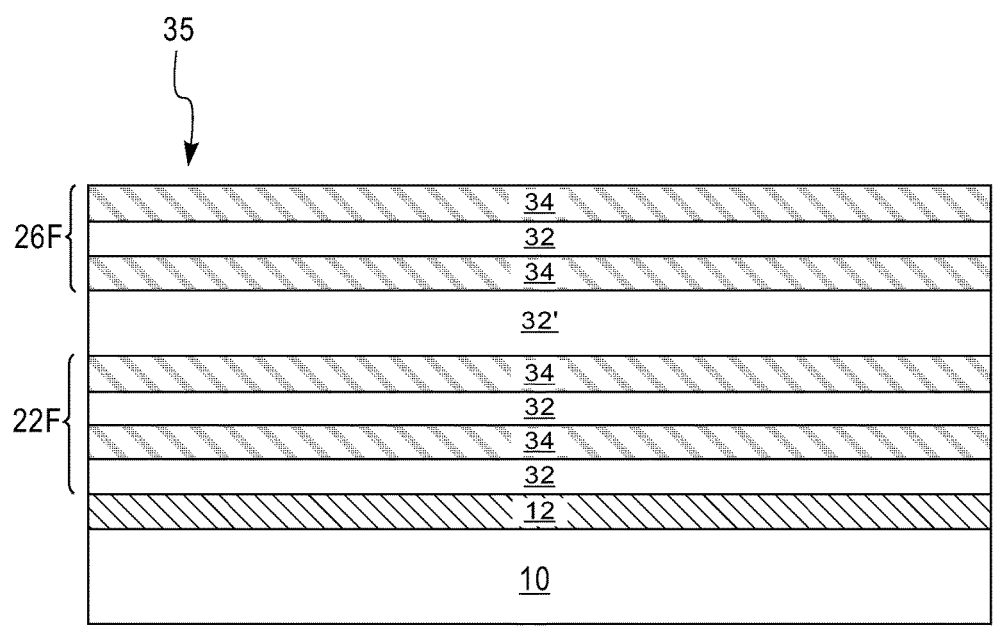
FIG. 2B is a cross-section view of the exemplary semiconductor structure of FIG. 2A along line B-B' of FIG. 2A.

Referring to FIGS. 2A and 2B, the semiconductor material stack 20 and the doped semiconductor PTS layer 12L are patterned, for example, by lithography and etching, to form at least one fin stack 35 extending upwards from the topmost surface of the semiconductor substrate 10. Each fin stack 35 includes, from bottom to top, a doped semiconductor PTS fin 12 retained from the doped semiconductor PTS layer 12L, a first fin sub-stack 22F retained from the first sub-stack 22, an inter-stack sacrificial fin 32' retained from the inter-stack sacrificial material layer 32L' and a second fin sub-stack 26F retained from the second sub-stack 26. Each of the first fin sub-stack 22F and the second fin sub-stack 26F includes alternating sacrificial fins 32 and semiconductor fins 34 retained from the sacrificial material layers 32L and the semiconductor material layers 34L, respectively.

The patterning of the semiconductor material stack 20 can be performed by first applying a mask layer (not shown) over a topmost surface of the semiconductor material stack 20 and lithographically patterned to define a set of areas covered by a patterned mask layer. The mask layer can be a photoresist layer or a photoresist layer in conjunction with a hardmask layer(s). The semiconductor material stack 20 and the doped semiconductor PTS layer 12L are then etched by an anisotropic etch using the patterned mask layer as an etch mask. The anisotropic etch can be a dry etch such as, for example reactive ion etch (RIE), a wet etch or a combination thereof. After formation of the at least one fin stack 35, the patterned mask layer can be removed, for example, by oxygen plasma. Other methods known in the art, such as sidewall image transfer (SIT) or directional self-assembly (DSA), can also be used to pattern the upper portion of the bulk semiconductor substrate to provide the at least one fin stack 35. Each of the sacrificial fins 32, 32' and semiconductor fins 34 formed can have a width from 5 nm to 20 nm, although lesser and greater widths can also be employed.

Figure 3:
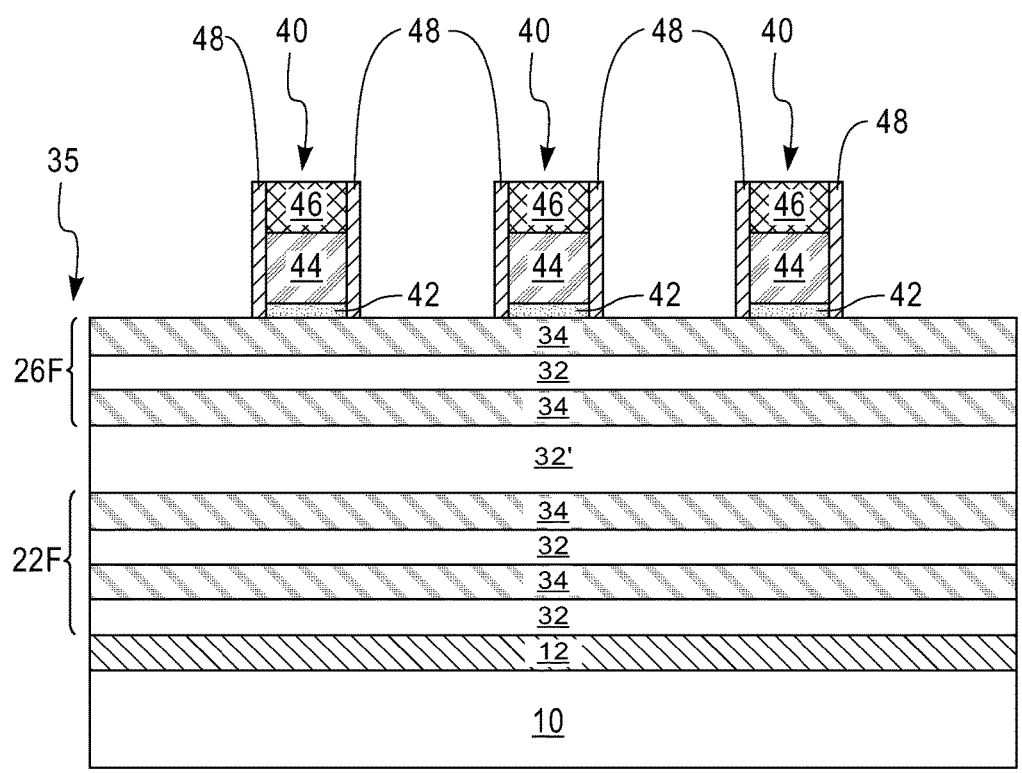
FIG. 3 is a cross-sectional view of the exemplary semiconductor structure of FIGS. 2A-2B after forming sacrificial gate structures on portions of the at least one fin stack.

Referring to FIG. 3, sacrificial gate structures 40 are formed over the at least one fin stack 35. Each sacrificial gate structure 40 includes a sacrificial gate stack straddling over a portion of the at least one fin stack 35 and a gate spacer 48 formed on sidewalls of the gate stack. By "straddling over" it is meant that a sacrificial gate stack is formed atop and along sidewalls of a fin stack. The term "sacrificial gate stack" as used herein refers to a placeholder structure for a subsequently formed functional gate stack. The term "functional gate stack" as used herein refers to a permanent gate stack used to control output current (i.e., flow of carriers in the channel) of a semiconducting device through electrical fields or magnetic fields. It should be noted that although multiple sacrificial gate structures are described and illustrated, the present application can also be employed when a single sacrificial gate structure is formed.

Each of the sacrificial gate stacks includes, from bottom to top, a sacrificial gate dielectric 42, a sacrificial gate conductor 44 and a sacrificial gate cap 46. The sacrificial gate stacks (42, 44, 46) can be formed by first providing a sacrificial material stack (not shown) that includes, from bottom to top, a sacrificial gate dielectric layer, a sacrificial gate conductor layer and a sacrificial gate cap layer over the at least one fin stack 35 and the semiconductor substrate 10, and by subsequently patterning the sacrificial material stack.

The sacrificial gate dielectric layer can include silicon oxide, silicon nitride, or silicon oxynitride. The sacrificial gate dielectric layer can be formed utilizing a conventional deposition process such as, for example, chemical vapor deposition (CVD) or physical vapor deposition (PVD). The sacrificial gate dielectric layer can also be formed by conversion of surface portions of at least one fin stack 35 utilizing thermal oxidation or nitridation. The thickness of the sacrificial gate dielectric layer can be from 1 nm to 10 nm, although lesser and greater thicknesses can also be employed. In some embodiments of the present application, the sacrificial gate dielectric layer can be omitted.

The sacrificial gate conductor layer can include a semiconductor material such as polysilicon or a silicon-containing semiconductor alloy such as a silicon-germanium alloy. The sacrificial gate conductor layer can be formed utilizing a conventional deposition process such as, for example, CVD or plasma-enhanced chemical vapor deposition (PECVD). The thickness of the sacrificial gate conductor layer can be from 20 nm to 300 nm, although lesser and greater thicknesses can also be employed.

The sacrificial gate cap layer can include a dielectric material such as an oxide, a nitride or an oxynitride. In one embodiment, the sacrificial gate cap layer is composed of silicon nitride. The sacrificial gate cap layer can be formed utilizing a conventional deposition process such as, for example, CVD or PECVD. The sacrificial gate cap layer that is formed may have a thickness from 10 nm to 200 nm, although lesser and greater thicknesses can also be employed.

The sacrificial material stack can be patterned by lithography and etching. For example, a photoresist layer (not shown) may be applied over the topmost surface of the sacrificial material stack and lithographically patterned by lithographic exposure and development. The pattern in the photoresist layer is sequentially transferred into the sacrificial material stack by at least one anisotropic etch. The anisotropic etch can be a dry etch such as, for example, RIE, a wet etch or a combination thereof. The remaining photoresist layer can be subsequently removed by, for example, ashing.

The gate spacers 48 can include a dielectric material such as, for example, an oxide, a nitride, an oxynitride or any combination thereof. In one embodiment, each gate spacer 48 is composed of silicon nitride. The gate spacers 48 can be formed by first providing a conformal gate spacer material layer (not shown) on exposed surfaces of the sacrificial gate stacks (42, 44, 46), the at least one fin stack 35 and the semiconductor substrate 10 and then etching the gate spacer material layer to remove horizontal portions of the gate spacer material layer. The gate spacer material layer can be provided by a deposition process including, for example, CVD, PECVD or atomic layer deposition (ALD). The etching of the gate spacer material layer may be performed by a dry etch process such as, for example, RIE. Vertical portions of the gate spacer material layer present on the sidewalls of sacrificial gate stacks (42, 44, 46) constitute gate spacers 48. The width of each gate spacer 48, as measured at the base, can be from 5 nm to 100 nm, although lesser and greater widths can also be employed.

Figure 4:
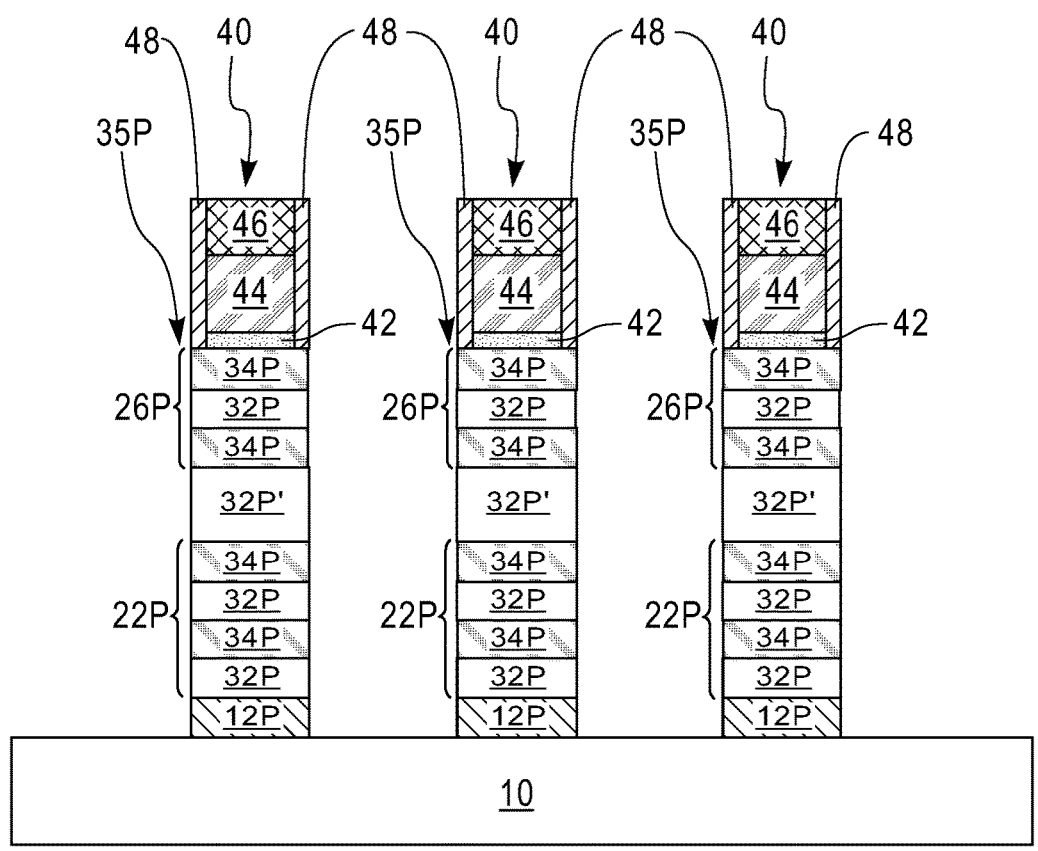
FIG. 4 is a cross-sectional view of the exemplary semiconductor structure of FIG. 3 after removing portions of the at least one fin stack not covered by the sacrificial gate structures to provide a fin stack portion including alternating sacrificial fin portions and semiconductor fin portions beneath each of the sacrificial gate structures.

Referring to FIG. 4, portions of the at least one fin stack 35 not covered by the sacrificial gate structures 40 are removed to provide a fin stack portion 35P beneath each of the sacrificial gate structures 40. Each fin stack portion 35P includes, from bottom to top, a doped semiconductor PTS fin portion 12P retained from the doped semiconductor PTS fin 12, a first fin sub-stack portion 22P retained from the first fin sub-stack 22F, an inter-stack sacrificial fin portion 32P' retained from the inter-stack sacrificial fin 32' and a second fin sub-stack portion 26P retained from the second fin sub-stack 26F. Each of the first fin sub-stack portion 22P and the second fin sub-stack portion 26P includes alternating sacrificial fin portions 32P and semiconductor fin portions 34P retained from the sacrificial fins 32 and the semiconductor fins 34, respectively.

The exposed portions of the at least one fin stack 35 may be removed using an anisotropic etch that removes the semiconductor materials of the sacrificial fins 32, 32', the semiconductor fins 34, and the doped semiconductor PTS fin 12 without substantially etching the surrounding structures, including the semiconductor substrate 10, the sacrificial gate caps 46 and gate spacers 48. The anisotropic etch can be a dry etch such as RIE.

Figure 5:
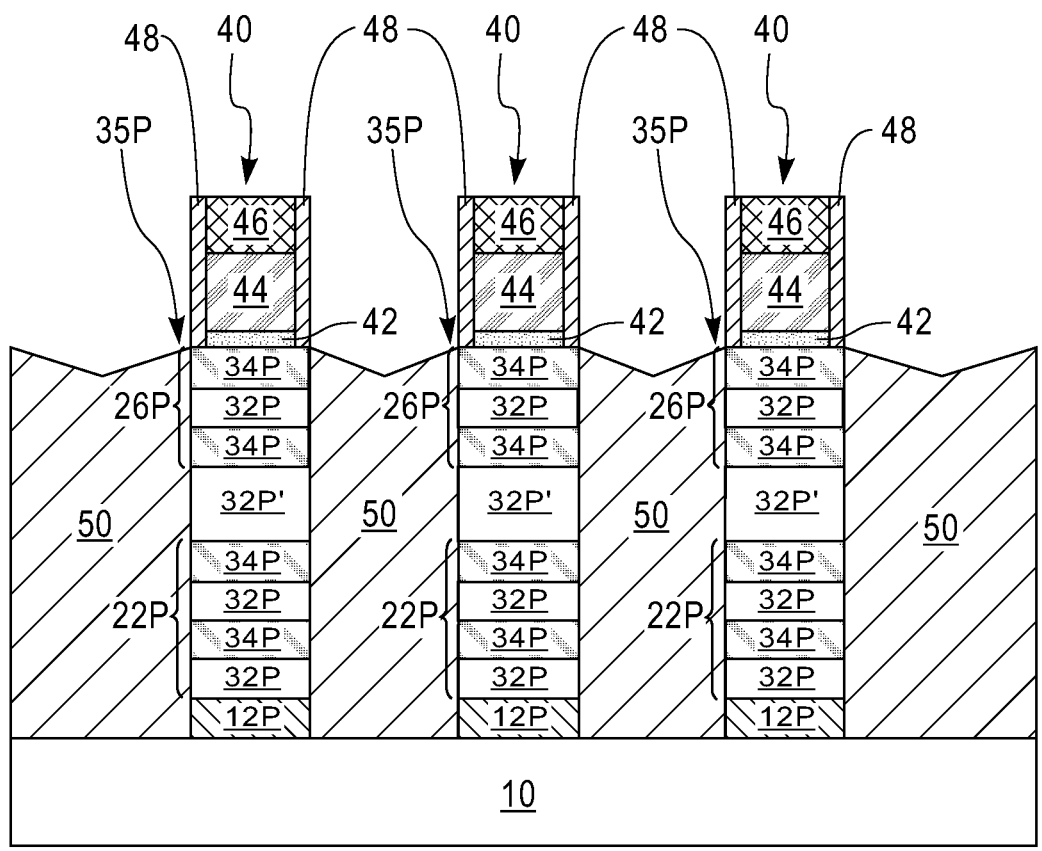
FIG. 5 is a cross-sectional view of the exemplary semiconductor structure of FIG. 4 after forming first epitaxial semiconductor regions on end walls of the fin stack portion beneath each of the sacrificial gate structures.

Referring to FIG. 5, first epitaxial semiconductor regions 50 are formed by epitaxially depositing a semiconductor material on exposed semiconductor surfaces, i.e., a topmost surface of the semiconductor substrate 10 and end wall surfaces of the doped semiconductor PTS fin portions 12P, the inter-stack sacrificial fin portions 32P', and sacrificial fin portions 32P and semiconductor fin portions 34P in both the first and second fin sub-stack portions 22P, 26P, but not on dielectric surfaces such as the surfaces of the sacrificial gate caps 46 and the gate spacers 48. The epitaxial growth process continues until the first epitaxial semiconductor regions 50 merge adjacent fin stack portions 35P. Depending on the type of nanowire FETs being formed (i.e., p-type FETs or n-type FETs) from the first fin sub-stack portions 22P, the first epitaxial semiconductor regions 50 may be composed of, for example, Si, SiGe, or carbon doped silicon (Si:C). The dopants (i.e., p-type dopants or n-type dopants) can be incorporated into the first epitaxial semiconductor regions 50 during the epitaxial growth, or after epitaxial growth by one of ion implantation or gas phase doping. The dopant concentration can be from $1 \times 10^{19}$ atoms/cm$^3$ to $2 \times 10^{21}$ atoms/cm$^3$, although lesser and greater dopant concentration can also be employed. In one embodiment, the first epitaxial semiconductor regions 50 may be composed of phosphorous doped Si:C for n-type FETs.

Figure 6:
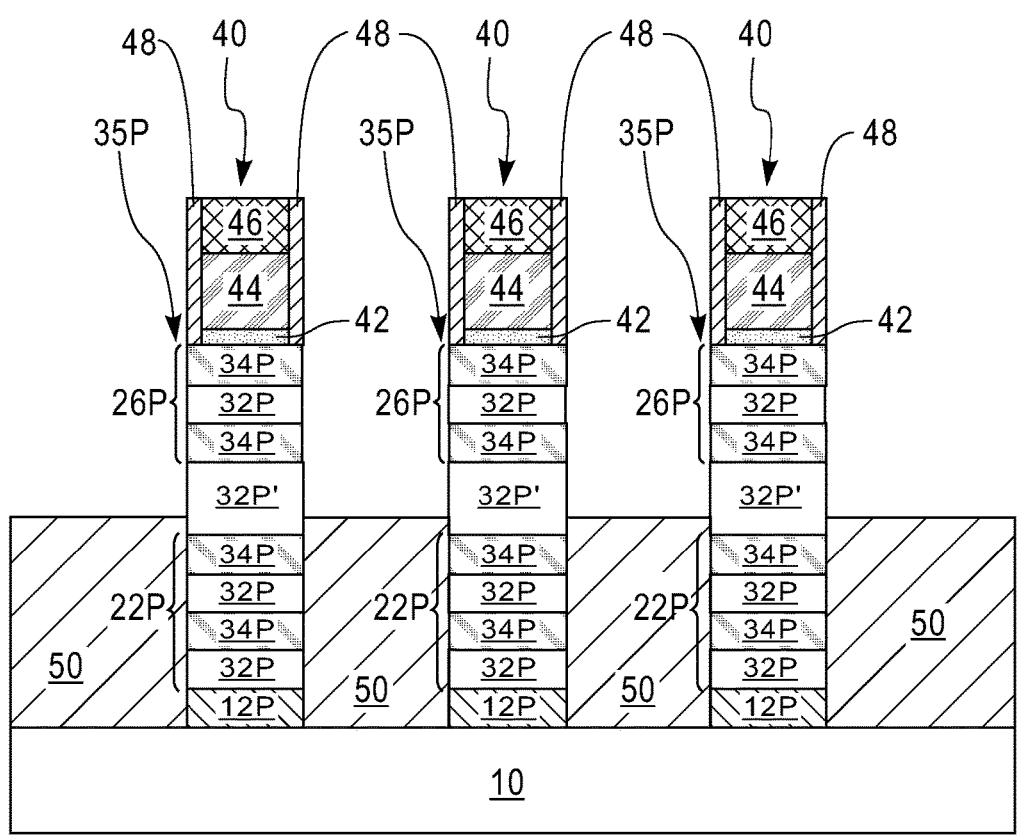
FIG. 6 is a cross-sectional view of the exemplary semiconductor structure of FIG. 5 after removing the first epitaxial semiconductor regions from the end walls of an upper portion of the fin stack portion beneath each of the sacrificial gate structures, while maintaining the first epitaxial semiconductor regions on the end walls of a lower portion of the fin stack portion underlying the upper portion of the fin stack portion.

Referring to FIG. 6, the first epitaxial semiconductor regions 50 are recessed such that the first epitaxial semiconductor regions 50 are removed from the end walls of the second fin sub-stack portion 26P, while maintaining the first epitaxial semiconductor regions 50 on end walls of the doped semiconductor PTS fin portions 12P and the first fin sub-stack portions 22P. The first epitaxial semiconductor regions 50 serve as source/drain regions for bottom nanowire FETs subsequently formed. The recessing of the first epitaxial semiconductor regions 50 can be performed by a recess etch. The recess etch can be an anisotropic etch or an isotropic etch. After recess, the topmost surfaces of the first epitaxial semiconductor regions 50P are located below the topmost surfaces of the inter-stack sacrificial fin portions 32P'. In one embodiment and as shown, the topmost surfaces of the first epitaxial semiconductor regions 50P are located between the topmost surfaces and the bottommost surfaces of the inter-stack sacrificial fin portions 32P'. The recessing of the first epitaxial semiconductor regions 50 re-exposes end walls of the second fin sub-stack portions 26P.

Figure 7:
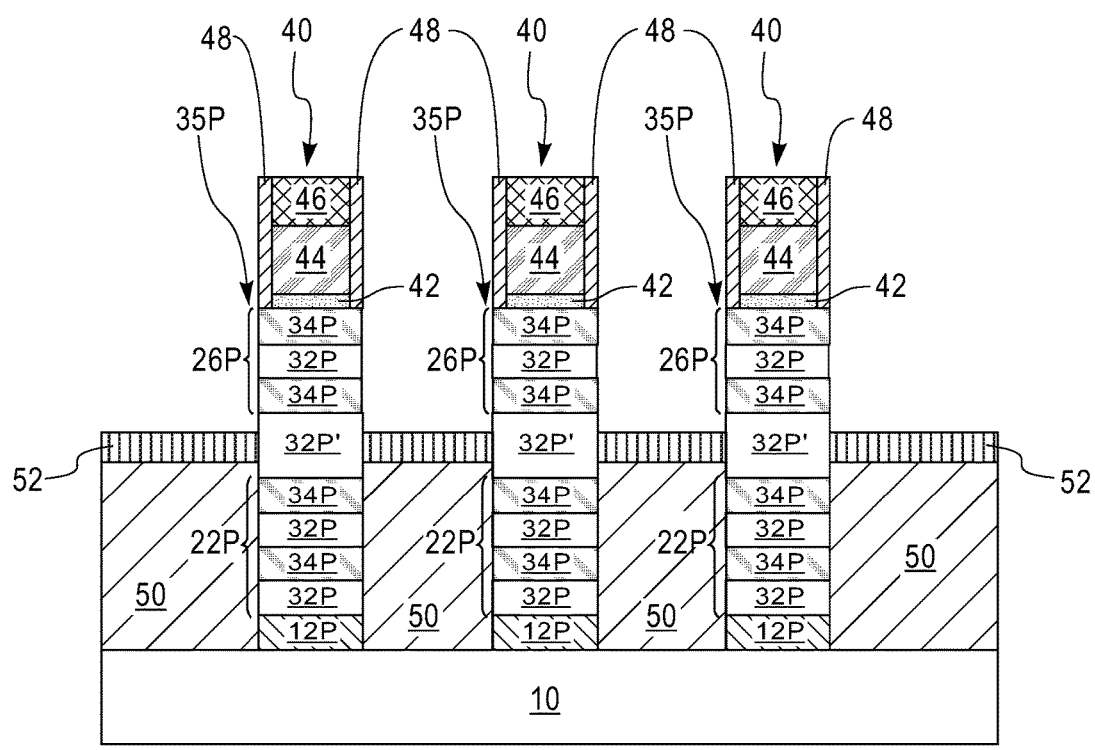
FIG. 7 is a cross-sectional view of the exemplary semiconductor structure of FIG. 6 after forming an insulator layer over the semiconductor substrate covering an entirety of the first epitaxial semiconductor regions.

Referring to FIG. 7, an insulator layer 52 is formed over the first epitaxial semiconductor regions 50 and the semiconductor substrate 10. The insulator layer 52 covers an entirety of the first epitaxial semiconductor regions 50 that are formed on the end walls of the first fin sub-stack portions 22P. The topmost surface of the insulator layer 52 can be located at, or below, the topmost surfaces of the inter-stack sacrificial fin portions 32P'. Thus, after formation of the insulator layer 52, the end walls of the second fin sub-stack portions 26P remain exposed. In some embodiments of the present application and as shown, the topmost surface of the insulator layer 52 is located below the topmost surfaces of the inter-stack sacrificial fin portions 32P'. The sidewalls of upper portions of the inter-stack sacrificial fin portions 32P' are thus exposed.

The insulator layer 52 may include a dielectric material that has different etching selectivity with respect to the dielectric material that provides the gate spacers 48. For example and when each gate spacer 48 includes a dielectric nitride, the insulator layer 52 may include a dielectric oxide such as silicon dioxide.

The insulator layer 52 can be formed utilizing a sequence of deposition and etch back processes. The dielectric material that provides the insulator layer 52 may be first deposited, for example, by CVD or PVD. After deposition, the deposited dielectric material is recessed by a selective etch to provide the insulator layer 52. The selective etch can be an anisotropic etch such as RIE that removes the dielectric material that provides the insulator layer 52 selective to the dielectric material that provide the gate spacers 48.

Figure 8:
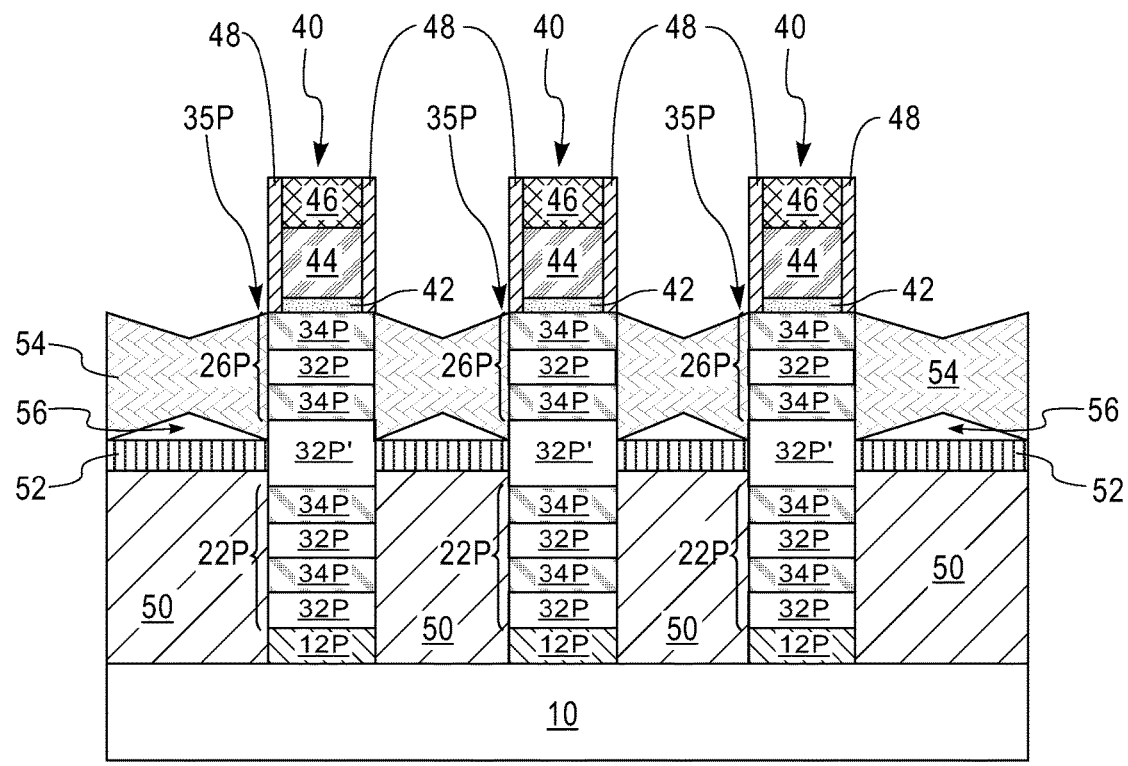
FIG. 8 is a cross-sectional view of the exemplary semiconductor structure of FIG. 7 after forming second epitaxial semiconductor regions on end walls of the upper portion of the fin stack portion beneath each of the sacrificial gate structures.

Referring to FIG. 8, second epitaxial semiconductor regions 54 are formed by epitaxially depositing a semiconductor material on exposed semiconductor surfaces, i.e., end wall surfaces of the upper portion of the inter-stack sacrificial fin portions 32P', if exposed, and sacrificial fin portions 32P and semiconductor fin portions 34P in the second fin sub-stack portions 26P, but not on dielectric surfaces such as the surfaces of the sacrificial gate caps 46, the gate spacers 48 and the insulator layer 52. The epitaxial growth process continues until the second epitaxial semiconductor regions 54 merge adjacent second fin sub-stack portions 26P. The second epitaxial semiconductor regions 54 serve as source/drain regions for top nanowire FETs subsequently formed. The top nanowire FETs typically have a conductivity type opposite to the conductivity type the bottom nanowire FETs. In one embodiment and when the bottom nanowire FETs are n-type FETs, the top nanowire FETs are p-type FETs, and vice versa. Depending on the type of nanowire FETs being formed (i.e., p-type FETs or n-type FETs) from the second fin sub-stack portions 26P, the second epitaxial semiconductor regions 54 may be composed of, for example, Si, SiGe, or carbon doped silicon (Si:C). The dopants (i.e., p-type dopants or n-type dopants) can be incorporated into the second epitaxial semiconductor regions 54 during the epitaxial growth, or after epitaxial growth by one of ion implantation or gas phase doping. The dopant concentration can be from $1 \times 10^{19}$ atoms/cm$^3$ to $2 \times 10^{21}$ atoms/cm$^3$, although lesser and greater dopant concentration can also be employed. In one embodiment and when each first epitaxial semiconductor region 50 is composed of phosphorus doped Si:C for n-type FETs, each second epitaxial semiconductor region 54 may be composed of boron doped SiGe for p-type FETs.

In some embodiments of the present application, and as illustrated in FIG. 8, since the semiconductor material that provides the second epitaxial semiconductor regions 54 does not nucleate on, or grow from, the insulator layer 52, a void 56 may be formed between each of the second epitaxial semiconductor regions 54 and the insulator layer 52. In such an embodiment, the second epitaxial regions 54 have a faceted (i.e., non-planar surface). In other embodiments (not shown), no voids are formed.

Figure 9:
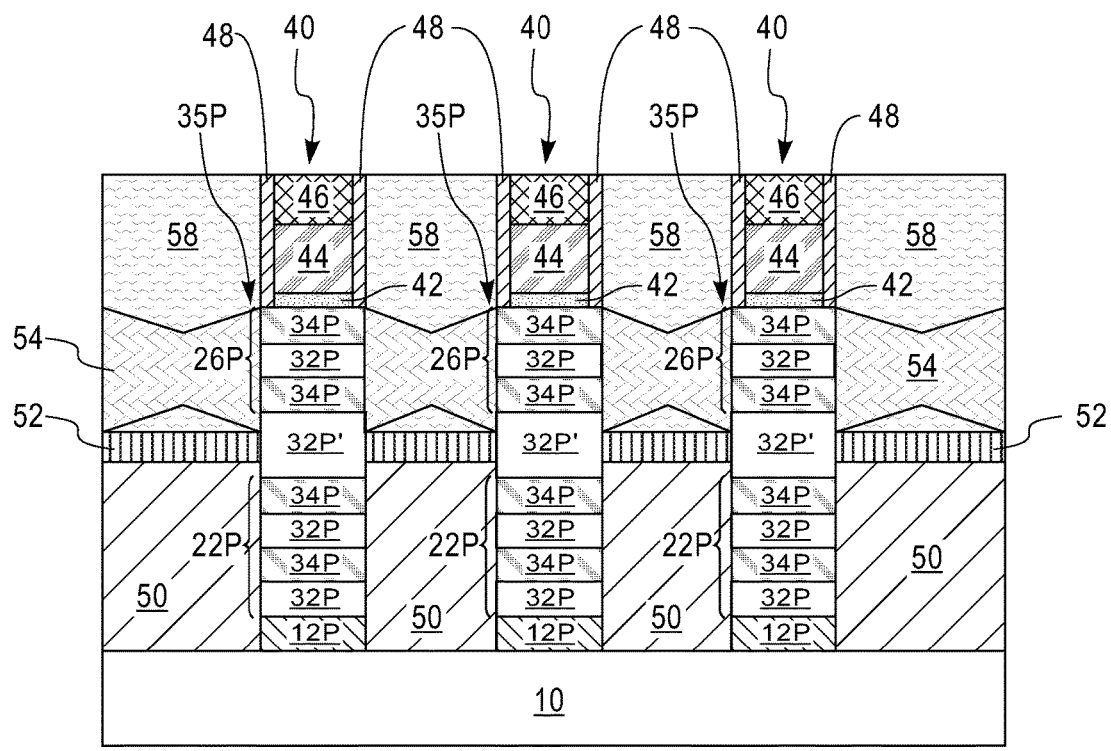
FIG. 9 is a cross-sectional view of the exemplary semiconductor structure of FIG. 8 after forming an interlevel dielectric (ILD) layer over the second epitaxial semiconductor regions and the insulator layer.

Referring to FIG. 9, an interlevel dielectric (ILD) layer 58 is formed on the second epitaxial semiconductor regions 54 and the insulator layer 52. The ILD layer 58 completely fills the spaces between the sacrificial gate structures 40 and the voids 56, if present. The ILD layer 58 may include a dielectric material that can be easily planarized. For example, the ILD layer 58 may include a doped silicate glass, an undoped silicate glass (silicon oxide), an organosilicate glass (OSG), or a porous dielectric material. In one embodiment, the ILD layer 58 may be made of a same dielectric material as the insulator layer 52, so that the ILD layer 58 is indistinguishable for the insulator layer 52 after deposition.

The ILD layer 58 can be formed by CVD, PVD or spin coating. The ILD layer 58 can be initially formed such that an entirety of the topmost surface of the ILD layer 58 is formed above the topmost surfaces of the sacrificial gate structures 40 (i.e., topmost surfaces of the sacrificial gate caps 46). The ILD layer 58 can be subsequently planarized, for example, by chemical mechanical planarization (CMP) and/or a recess etch using the sacrificial gate caps 46 as a polishing and/or an etch stop. After the planarization, the ILD layer 58 has a topmost surface coplanar with the topmost surfaces of the sacrificial gate caps 46.

Figure 10:
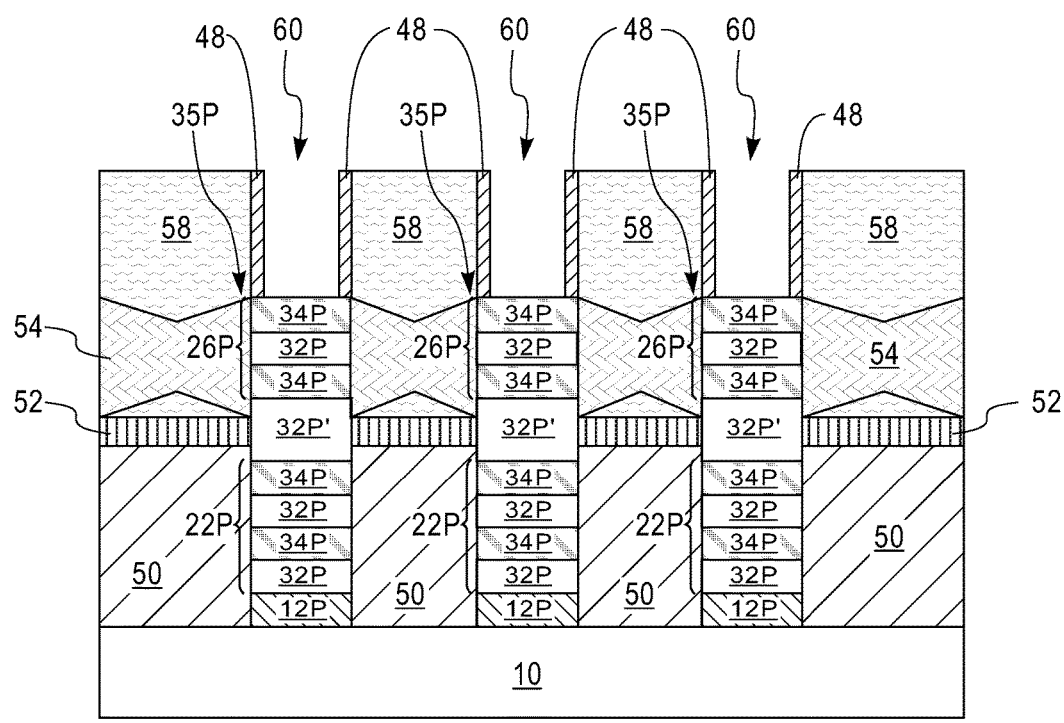
FIG. 10 is a cross-sectional view of the exemplary semiconductor structure of FIG. 9 after removing sacrificial gate stacks in the sacrificial gate structures to provide gate cavities.

Referring to FIG. 10, the sacrificial gate stacks (42, 44, 46) are removed from the sacrificial gate structures 40 to provide gate cavities 60. Various components of the sacrificial gate stacks (42, 44, 46) can be removed selectively to the semiconductor materials that provides the semiconductor substrate 10, the doped semiconductor PTS fin portions 12P, and sacrificial fin portions 32P and semiconductor fin portions 34 in the first and second fin sub-stack portions 22P, 26P and the inter-stack sacrificial fin portions 24P, and the dielectric materials that provide the gate spacers 48 and the ILD layer 58 by at least one etch. The at least one etch can be a dry etch such as RIE, a wet etch such as an ammonia etch or a combination thereof. Each of the gate cavities 60 occupies a volume from which a corresponding sacrificial gate stack (42, 44, 46) is removed and is laterally confined by inner sidewalls of the gate spacer 48. The sidewalls of the fin stack portions 35P are physically exposed inside the gate cavities 60.

Figure 11:
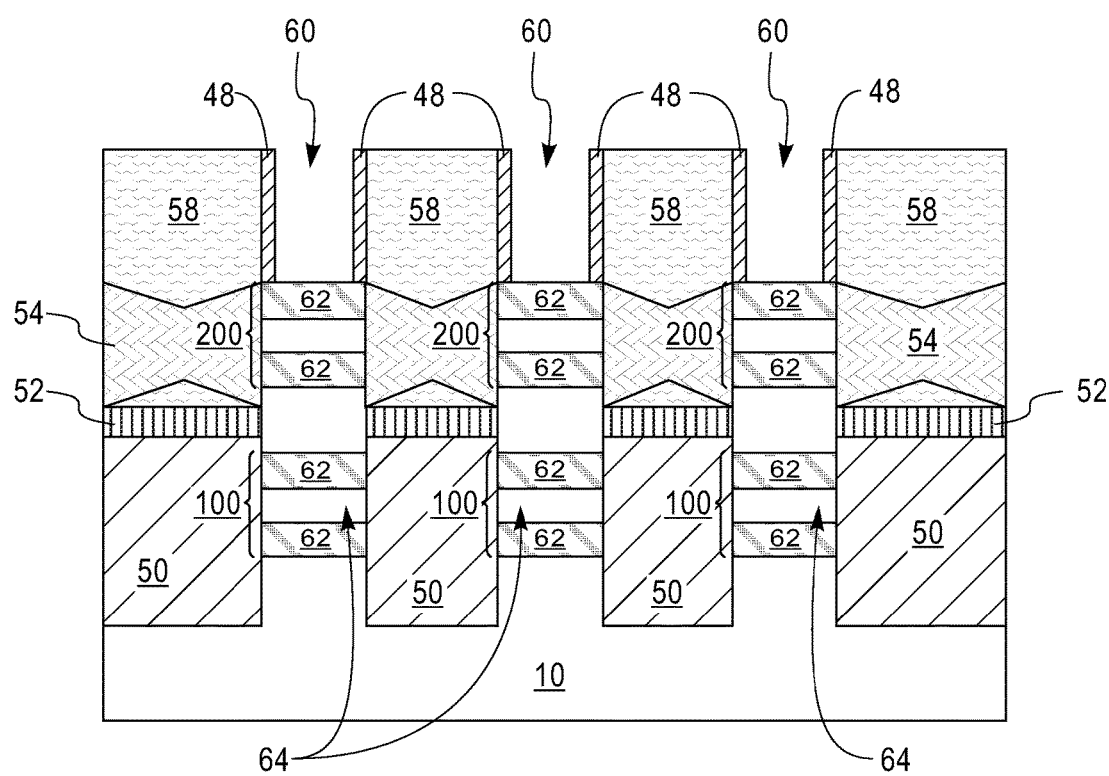
FIG. 11 is a cross-sectional view of the exemplary semiconductor structure of FIG. 10 after removing sacrificial fin portions in each fin stack portion to provide a gap beneath each of the semiconductor fin portions within each fin stack portion.

Referring to FIG. 11, the sacrificial fin portions 32P in the first and second fin sub-stack portions 22P and 26P, the inter-stack sacrificial fin portions 32P' and the doped semiconductor PTS fin portions 12P, if present, are removed by etching. The etch can be a dry etch or a wet etch that removes semiconductor materials that provide the sacrificial fin portions 32P, inter-stack sacrificial fin portions 32P', the doped semiconductor PTS fin portions 12P selective to semiconductor materials that provide the semiconductor fin portions 34P, semiconductor substrate 10 and first and second epitaxial semiconductor region 52, 54. Each semiconductor fin portion 34P remained in the structure can now be referred to as a semiconductor nanowire 62. Semiconductor nanowires 62 derived from the semiconductor fin portions 34P in a first fin sub-stack portion 22P under a gate cavity 60 collectively can be referred to as a first stacked nanowire array 100. Semiconductor nanowires 62 derived from the semiconductor fin portions 34P in a second fin sub-stack portion 26P under a gate cavity 60 collectively can be referred to as a second stacked nanowire array 200. As shown, the semiconductor nanowires 62 in the first stacked nanowire array 100 and the second stacked nanowire array 200 are vertically spaced apart from one another. A gap 64 is present beneath each of the vertically spaced apart semiconductor nanowires 62. The semiconductor nanowire 62 in the first stacked nanowire array 100 laterally surrounded by the first epitaxial semiconductor regions 50 are for formation of bottom nanowire FETs of a first conductivity type, which can be n-type or p-type. The semiconductor nanowire 62 in the second stacked nanowire array 200 laterally surrounded by the second epitaxial semiconductor regions 54 are for formation of complementary top nanowire FETs.

Subsequently, the semiconductor nanowires 62 may be rounded by performing an annealing process in a hydrogen-containing ambient or through oxidation (not shown). The annealing temperature can be from 600° C. to 1000° C., although lesser and greater temperatures can also be employed.

Figure 12:
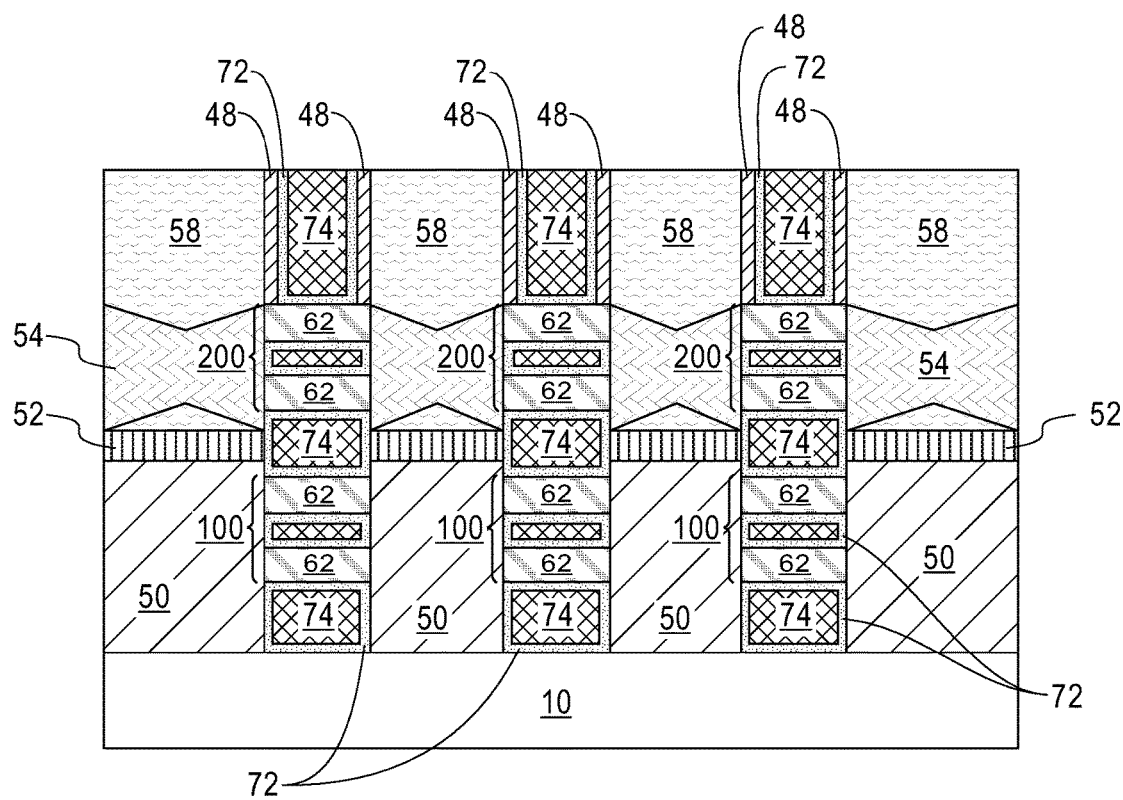
FIG. 12 is a cross-sectional view of the exemplary semiconductor structure of FIG. 11 after forming a functional gate stack filling each gate cavity as well as gaps within each gate cavity.

Referring to FIG. 12, a functional gate stack is formed within each gate cavity 60 and the gaps 64 beneath the vertically spaced apart semiconductor nanowires 62 within each gate cavity 60, thus wrapping around each of the semiconductor nanowires 62 in the first and second stacked nanowire array 100, 200. Each functional gate stack includes a gate dielectric 72 present on exposed surfaces of the semiconductor nanowires 62 in the first and second stacked nanowire array 100, 200 and a gate electrode 74 located over the gate dielectric 72. A functional gate stack (72, 74) and a gate spacer 48 laterally surrounding the functional gate stack (72, 74) together define a functional gate structure.

In each gate cavity 60, the gate dielectric 72 is U-shaped having a bottommost portion in direct contact with an upper surface of the topmost semiconductor nanowire 62 and vertical portions that are located on exposed sidewalls of a gate spacer 46 laterally surrounding the gate cavity 60. Within each gap 64, gate dielectric 72 surrounds gate electrode 74.

The gate dielectric 72 can be a high-k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g. silicon oxide, and a high-k gate dielectric can be formed.

The gate dielectric 72 can be formed by any deposition technique including, for example, CVD, PECVD, PVD, and ALD. The thickness of the gate dielectric 72 can be from 1 nm to 10 nm, although lesser and greater thicknesses can also be employed.

After providing the gate dielectric 72, the gate electrode 74 can be formed atop the gate dielectric 72 and filling the remaining space of each gate cavity 60 and each gap 64. The gate electrode 74 can include any conductive metal material including, for example, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate electrode 74 can be formed utilizing a deposition process including, for example, CVD, PECVD, PVD, ALD and other like deposition processes. When a metal silicide is formed, a conventional silicidation process is employed.

Stacked nanowire CMOS devices each having top nanowire FETs overlying complementary bottom nanowire FETs are thus formed. The bottom nanowire FETs includes semiconductor nanowires 62 of the first stacked nanowire array 100 and first epitaxial semiconductor regions 50. The top nanowire FETs includes semiconductor nanowires 62 of the second stacked nanowire array 200 and second epitaxial semiconductor regions 54. The bottom and top nanowire FETs share a same functional gate stack (72, 74) straddling over the semiconductor nanowires of first and second stacked nanowire arrays 100, 200.

Figure 13:
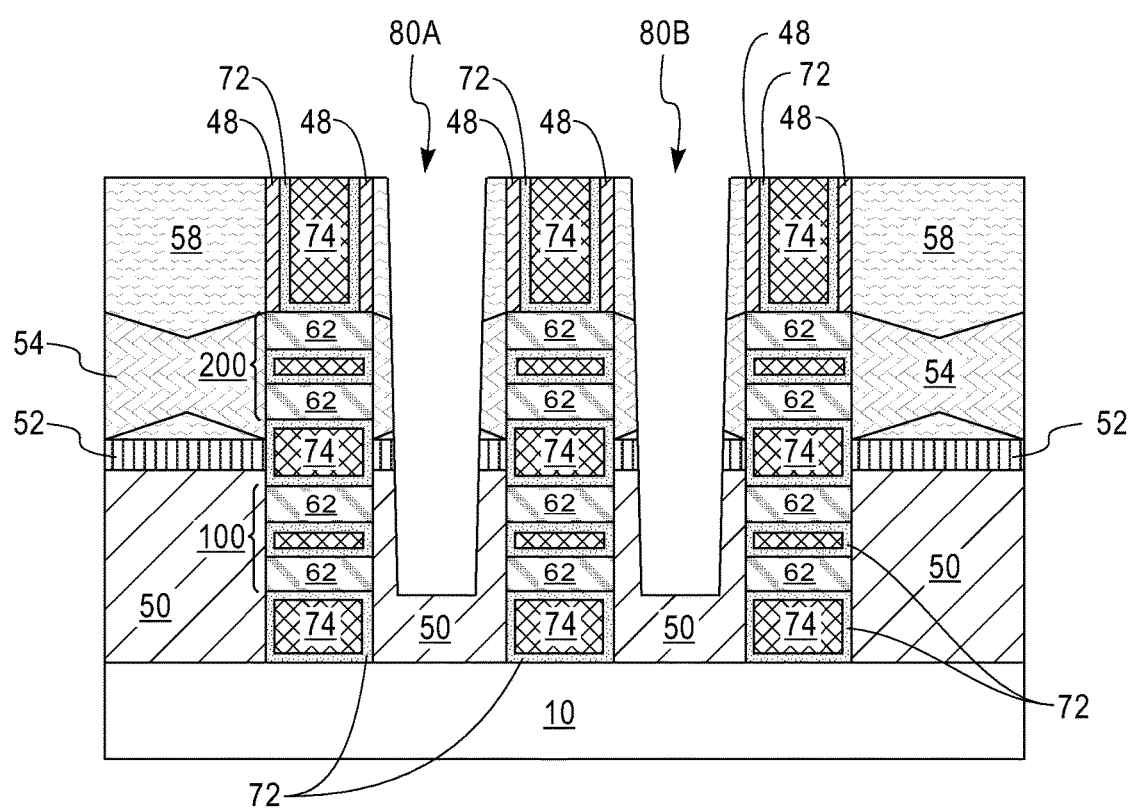
FIG. 13 is a cross-sectional view of the exemplary semiconductor structure of FIG. 12 after forming a first contact opening and a second contact opening on opposite sides of the functional gate stack.

Referring to FIG. 13, a first contact opening 80A is formed on one side of a functional gate structure (72, 74, 48) and a second contact opening 80B is formed on the opposite side of the functional gate structure (72, 74, 48). The first contact opening 80A extends through the ILD layer 58, one of the second epitaxial semiconductor regions 54 located on the one side of the functional gate structure (72, 74, 78) and the insulator layer 52 and into one of the first epitaxial semiconductor regions 50 located on the one side of the functional gate structure (72, 74, 78). The second contact opening 80B extends through the ILD layer 58, another of the second epitaxial semiconductor regions 54 located on the opposite side of the functional gate structure (72, 74, 78) and the insulator layer 52 and into another of the first epitaxial semiconductor regions 50 located on the opposite side of the functional gate structure (72, 74, 78). The first and second contact openings 80A, 80B can be formed by lithography and etching. The lithographic process includes forming a photoresist layer (not shown) atop the ILD layer 58 and the functional gate structures (72, 74, 48), exposing the photoresist layer to a desired pattern of radiation and developing the exposed photoresist layer utilizing a conventional resist developer. The etching process includes a dry etch, such as, for example, RIE or a wet chemical etch that selectively removes exposed portions of the ILD layer 58 and portions of the second epitaxial semiconductor regions 54, the insulator layer 52 and the first epitaxial semiconductor regions 50 located beneath the exposed portions of the ILD layer 58. After etching, the remaining portions of the photoresist layer can be removed by a conventional resist striping process, such as, for example, ashing.

Figure 14:
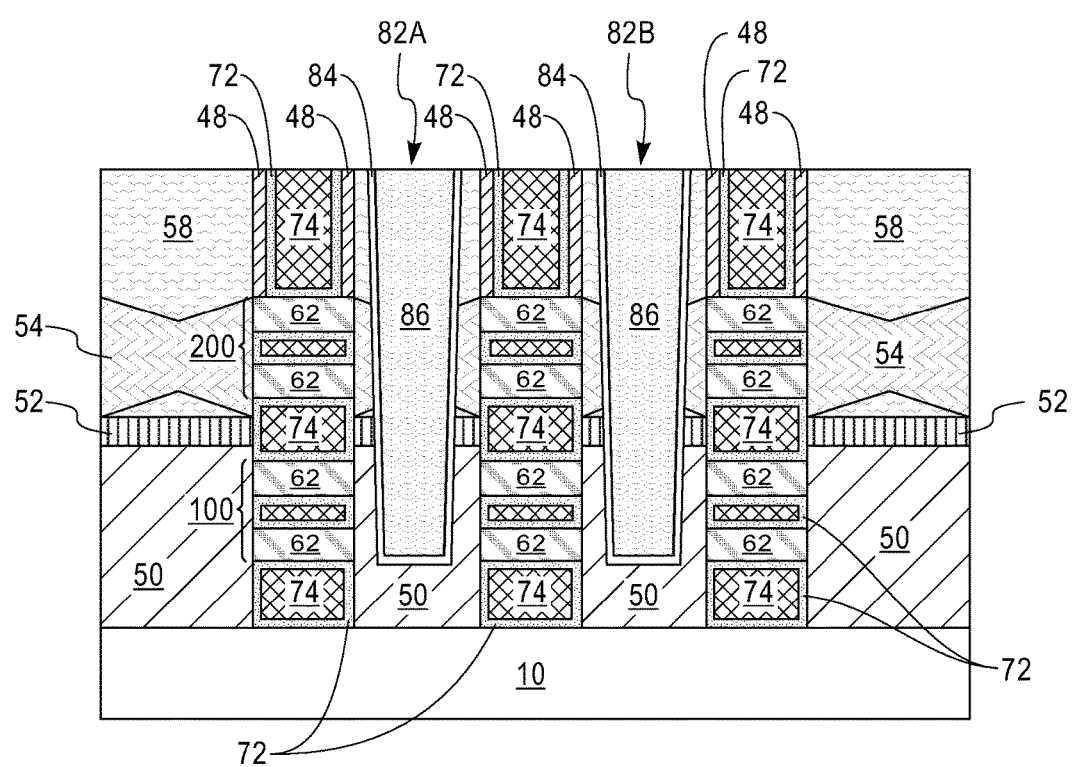
FIG. 14 is a cross-sectional view of the exemplary semiconductor structure of FIG. 13 after forming a first contact structure within the first contact opening and a second contact structure within the second contact opening. The first contact structure and the second contact structure contact both the first and second epitaxial semiconductor regions.

Referring to FIG. 14, a first contact structure 82A is formed within the first contact opening 80A and a second contact structure 82B is formed within the second contact opening 80B. Each of the contact structures 82A, 82B includes a first contact liner 84 present on sidewalls and a bottom surface of each contact opening (80A or 80B) and a first contact conductor 86 surrounded by the first contact liner 84. The first contact structure 82A serves as a common source/drain contact structure for the bottom nanowire FETs and top nanowire FETs.

The first contact liner 84 may include Ti, Ta, Ni, Co, Pt, W, TiN, TaN, WN, WC, an alloy thereof, or a stack thereof such as Ti/TiN and Ti/WC. The first contact liner 84 can be formed by any deposition technique including, for example, CVD, PECVD, PVD, and ALD. The thickness of the first contact liner 84 can be from 1 nm to 5 nm, although lesser and greater thicknesses can also be employed.

After providing the first contact liner 84, the first contact conductor 86 can be formed atop the first contact liner 84 and filling the remaining space of each of the contact openings 80A, 80B. The first contact conductor 86 can include any conductive metal material including, for example, W, Al, Co, or an alloy thereof. The first contact conductor 86 can be formed utilizing a deposition process including, for example, CVD, PECVD, PVD and other like deposition processes. After deposition of the materials that provides the first contact liner 84 and the first contact conductor, any deposited materials that are located above the topmost surface of the ILD layer 58 can be removed by a planarization process such as, for example, CMP.

In some embodiments of the present application, before forming the first contact liner 84, a conventional silicidation process may be performed to form silicide or germicide on surfaces of the first and second epitaxial semiconductor regions exposed by the first and second contact openings (not shown).

Figure 15:
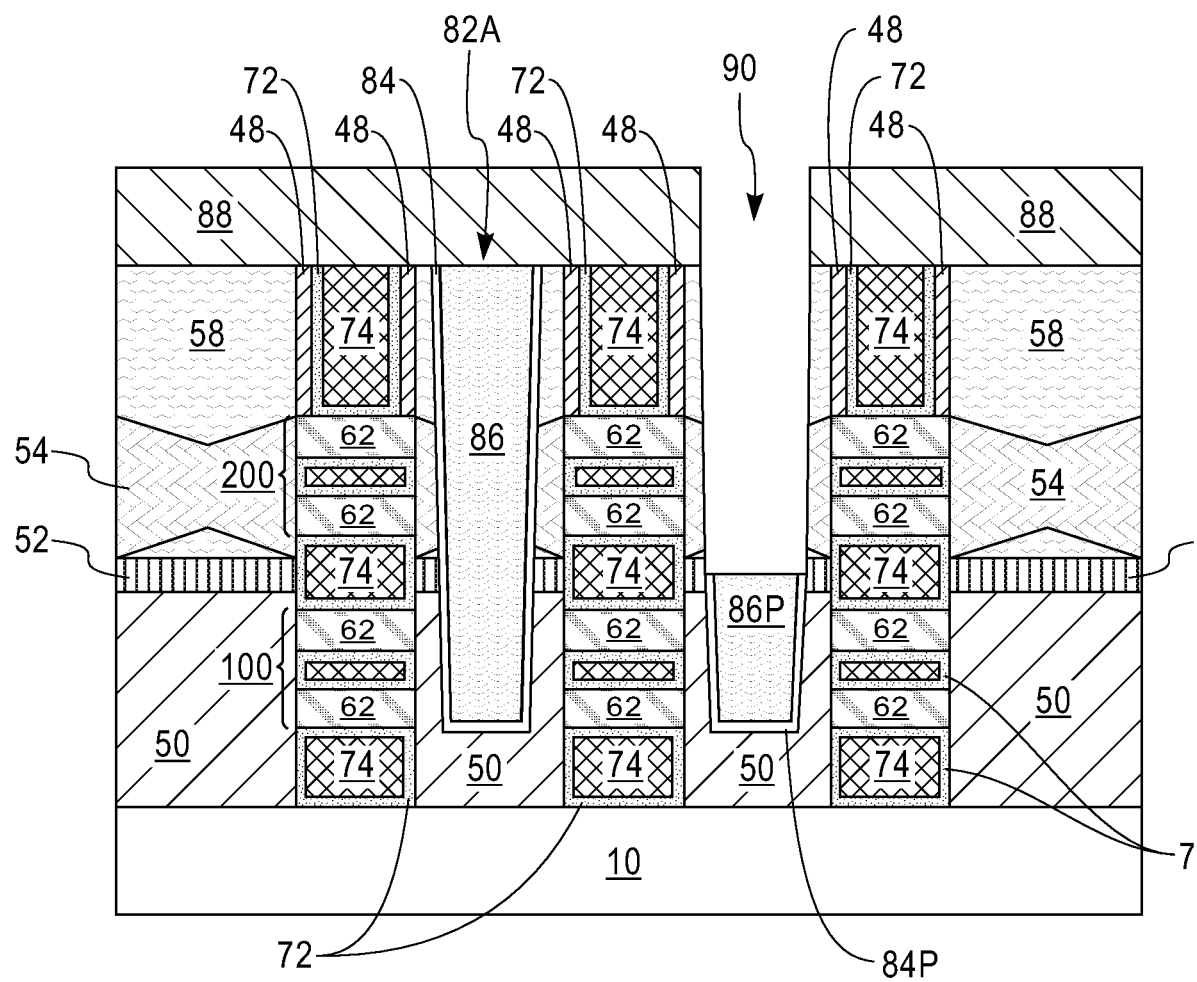
FIG. 15 is a cross-sectional view of the exemplary semiconductor structure of FIG. 14 after recessing the second contact structure to provide a first local source/drain contact structure only contacting the first epitaxial semiconductor regions.

Referring to FIG. 15, a mask layer (not shown) is applied over the ILD layer 58, the functional gate structures (72, 74, 48) and the first and second contact structures (82A, 82B) and lithographically patterned so that a patterned mask layer 88 covers the first contact structure 82A, while the second contact structure 82B is exposed. The mask layer can be a photoresist layer or a photoresist layer in conjunction with a hardmask layer(s).

Vertical portions of the first contact liner 84 and the first contact conductor 86 in the second contact structure 82B are recessed below the topmost surface of the insulator layer 52 by a recess etch. The recess etch can be a dry etch or wet etch that removes the materials of the first contact liner 84 and the first contact conductor 86 selective to dielectric materials of the ILD layer 58 and the insulator layer 52 and semiconductor materials of the first and second epitaxial semiconductor regions 50, 54. After etching, the patterned mask layer 88 can be removed by oxygen-based plasma etching.

A remaining portion of the first contact liner 84 is herein referred to as a first contact liner portion 84P, and a remaining portion of the first contact conductor 86 is herein referred to as a first contact conductor portion 86P. The first contact liner portion 84P and the first contact conductor portion 86P together define a first local source/drain contact structure that provides electrical connection to the source/drain regions (i.e., the first epitaxial semiconductor regions 50) of the bottom nanowire FETs. The topmost surfaces of the first contact liner portion 84P and the first contact conductor portion 86P can be located anywhere below the topmost surface of the insulator layer 52 as long as the first local source/drain contact structure (84P, 86P) contacts the first epitaxial semiconductor regions 50. In one embodiment and as shown, the topmost surfaces of the first contact liner portion 84P and the first contact conductor portion 86P are located between the topmost surface and bottommost surface of the insulator layer 52. A trench 90 is present above the first local source/drain contact structure (84P, 86P).

Figure 16:
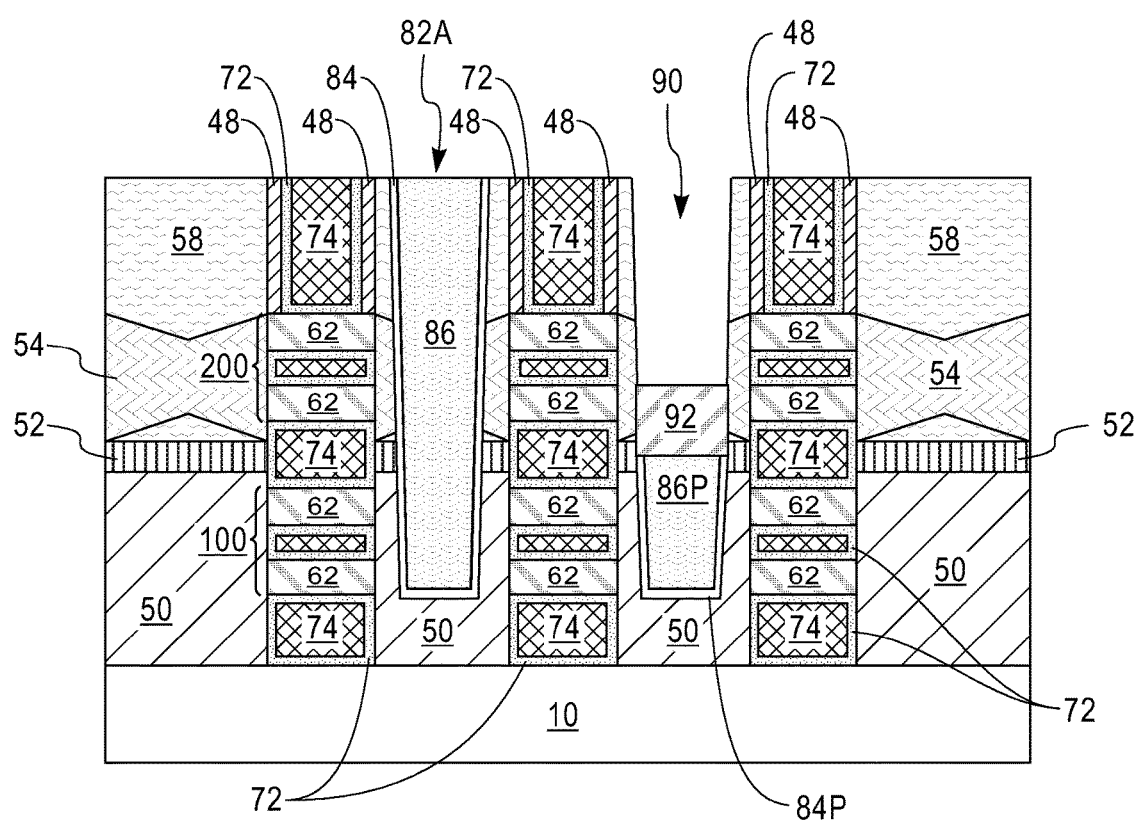
FIG. 16 is a cross-sectional view of the exemplary semiconductor structure of FIG. 15 after forming a trench isolation structure over the first local source/drain contact structure.

Referring to FIG. 16, a trench isolation structure 92 is formed at the bottom of the trench 90. The trench isolation structure 92 provides electrical isolation between the first local source/drain contact structure (84P, 86P) and a second local source/drain contact structure subsequently formed that provides electrical connection to the source/drain regions (i.e., the second epitaxial semiconductor regions 54) of the top nanowire FETs. The topmost surface of the trench isolation structure 92 can be located below the topmost surfaces of the second epitaxial semiconductor regions 54. In one embodiment and shown, the topmost surface of the trench isolation structure 92 can be located between the topmost surfaces and bottommost of the second epitaxial semiconductor regions 54.

The trench isolation structure 92 can be formed by filling the trench 90 with a trench dielectric material such as an oxide and recessing the deposited trench dielectric material. In one embodiment, trench fill can be performed utilizing a high-density plasma oxide deposition process. The recessing of the deposited trench dielectric material can be performed using a wet etch such as, for example, HF.

Figure 17:
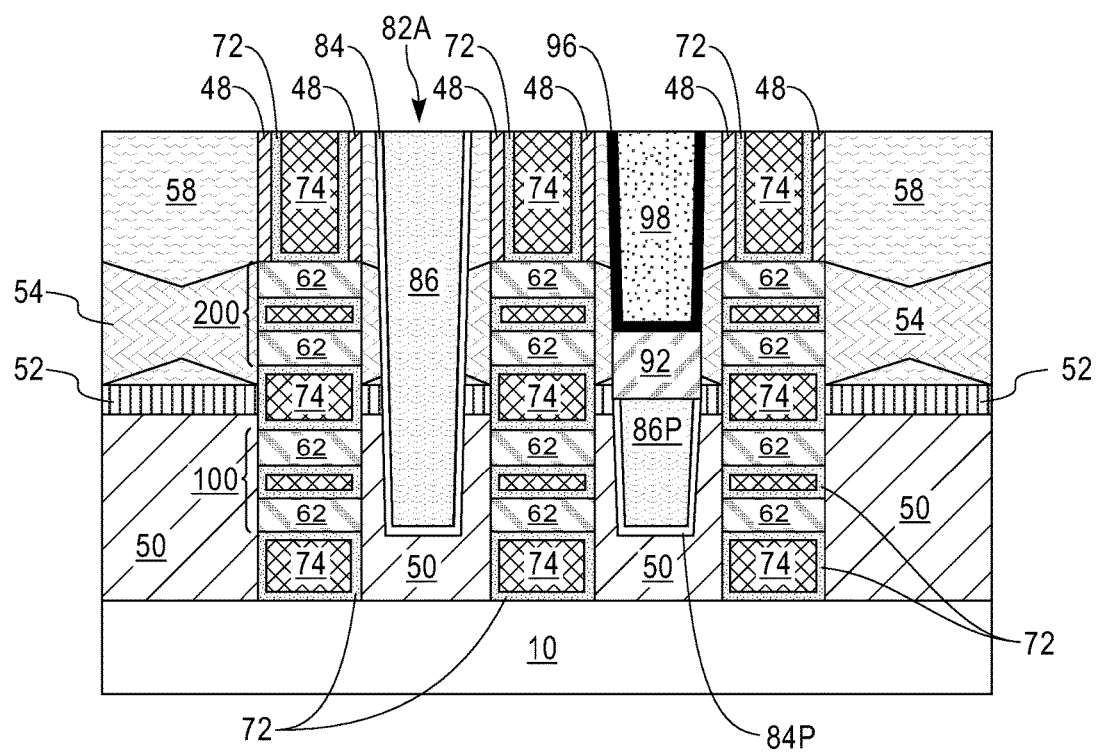
FIG. 17 is a cross-sectional view of the exemplary semiconductor structure of FIG. 16 after forming a second local source/drain contact structure over the trench isolation structure and contacting only with the second epitaxial source/drain regions.

Referring to FIG. 17, a second local source/drain contact structure is formed over the trench isolation structure 92 to completely fill the trench 90. The second local source/drain contact structure includes a second contact liner 96 present on exposed sidewalls of the trench 90 and the topmost surface of the trench isolation structure 92 and a second contact conductor 98 surrounded by the second contact liner 96.

The second contact liner 96 may include a metal the same as, or different from, that of the first contact liner 84. For example, the second contact liner 96 may include Ti, Ta, Ni, Co, Pt, W, TiN, TaN, WN, WC, an alloy thereof, or a stack thereof such as Ti/TiN and Ti/WC. The second contact liner 98 may include a metal the same as, or different from, that of the first contact conductor 86. For example, the second contact conductor 98 may include W, Al, Co, or an alloy thereof. The second contact liner 96 and the second contact conductor 98 can be formed by performing processing steps described above in FIG. 14 for formation of the first contact liner 84 and the first contact conductor 86.

The metal wiring to the common source/drain contact structure 82A and the second local source/drain contact structure (96, 98) can run, for example, from the top of these structures, while the metal wiring to the buried first local source/drain contact structure (84P, 86P) can run, for example, in a plane perpendicular to the plane of the paper in the illustration.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a plurality of vertically stacked and vertically spaced apart semiconductor nanowires located over a substrate, wherein the plurality of vertically stacked and vertically spaced apart semiconductor nanowires are organized into a lower nanowire array and an upper nanowire array overlying the lower nanowire array;
a functional gate structure straddling over the plurality of vertically stacked and vertically spaced apart semiconductor nanowires;
first epitaxial semiconductor regions of a first conductivity type laterally contacting end walls of the semiconductor nanowires in the lower nanowire array;
second epitaxial semiconductor regions of a second conductivity type opposite the first conductivity type laterally contacting end walls of the semiconductor nanowires in the upper nanowire array; and
an insulator layer located between the first epitaxial semiconductor region and the second epitaxial semiconductor regions.

2. The semiconductor structure of claim 1, wherein a topmost surface of the insulator layer contacts bottommost surfaces of the second epitaxial semiconductor regions, and a bottommost surface of the insulator layer contacts topmost surfaces of the first epitaxial semiconductor regions.

3. The semiconductor structure of claim 1, further comprising a common source/drain contact structure contacting one of the first epitaxial semiconductor regions and one of the second epitaxial semiconductor regions located on a first side of the functional gate structure.

4. The semiconductor structure of claim 3, further comprising a first local source/drain contact structure contacting another of the first epitaxial semiconductor regions located on a second side of the functional gate structure opposite the first side, and a second local source/drain contact structure overlying the first local source/drain contact structure and contacting another of the second epitaxial semiconductor regions located on the second side of the functional gate structure, wherein a trench isolation structure is located between the first local source/drain contact structure and the second local source/drain contact structure.

5. The semiconductor structure of claim 4, wherein a topmost surface of the first local source/drain contact structure is located below a topmost surface of the insulator layer.

6. The semiconductor structure of claim 4, wherein a topmost surface of the trench isolation structure is located below topmost surfaces of the second epitaxial semiconductor regions.

7. The semiconductor structure of claim 4, further comprising an interlevel dielectric (ILD) layer located over the second epitaxial semiconductor regions, the ILD layer laterally surrounding the functional gate structures, the common source/drain contact structure and the second local source/drain contact structure.

8. The semiconductor structure of claim 1, wherein the functional gate structure comprises a functional gate stack having a first portion located above a topmost semiconductor nanowire of the plurality of vertically stacked and vertically spaced apart semiconductor nanowires, and a second portion located beneath each semiconductor nanowires of the plurality of vertically stacked and vertically spaced apart semiconductor nanowires.

9. The semiconductor structure of claim 8, wherein the first portion of the functional gate stack comprises a U-shaped gate dielectric having a bottommost portion in direct contact with a topmost surface of the topmost semiconductor nanowire in the plurality of vertically stacked and vertically spaced apart semiconductor nanowires and a gate electrode located on the U-shaped gate dielectric.

10. The semiconductor structure of claim 8, wherein the second portion of the functional gate stack comprises a gate dielectric and a gate electrode surrounded by the gate dielectric.

11. The semiconductor structure of claim 8, wherein the insulator layer laterally contacts a portion of the second portion of the functional gate stack located between the lower nanowire array and the upper nanowire array.

12. The semiconductor structure of claim 8, wherein the functional gate structure comprises a gate spacer present on sidewalls of the first portion of the functional gate stack.

13. The semiconductor structure of claim 12, wherein the end walls of the semiconductor nanowires in the lower nanowire array and the end walls of the semiconductor nanowires in the upper nanowire array are vertically coincident with outer sidewalls of the gate spacer.

14. The semiconductor structure of claim 7, wherein each of the second epitaxial semiconductor regions has faceted surfaces, wherein a void is located between each of the second epitaxial semiconductor regions and the insulator layer.

15. The semiconductor structure of claim 14, wherein the ILD layer fills each void such that the ILD layer is in direct contact with a topmost surface of the insulator layer.

16. The semiconductor structure of claim 1, wherein the plurality of vertically stacked and vertically spaced apart semiconductor nanowires is vertically separated from each other by a first spacing, and the lower nanowire array is separated from the upper nanowire array by a second spacing greater than the first spacing.

17. The semiconductor structure of claim 1, wherein the first epitaxial semiconductor regions comprise phosphorous doped Si:C, and the second epitaxial semiconductor regions comprise boron doped SiGe.

18. The semiconductor structure of claim 4, wherein each of the common source/drain contact structure, the first local source/drain contact structure and the second local source/drain contact structure comprises a contact liner and a contact conductor.

19. A semiconductor structure comprising:
a plurality of vertically stacked and vertically spaced apart semiconductor nanowires located over a substrate, wherein the plurality of vertically stacked and vertically spaced apart semiconductor nanowires are organized into a lower nanowire array and an upper nanowire array;
a functional gate structure straddling over the plurality of vertically stacked and vertically spaced apart semiconductor nanowires;
first epitaxial semiconductor regions of a first conductivity type laterally contacting end walls of the semiconductor nanowires in the lower nanowire array;
second epitaxial semiconductor regions of a second conductivity type opposite the first conductivity type laterally contacting end walls of the semiconductor nanowires in the upper nanowire array;
an insulator layer located between the first epitaxial semiconductor region and the second epitaxial semiconductor regions;
a common source/drain contact structure contacting one of the first epitaxial semiconductor regions and one of the second epitaxial semiconductor regions located on a first side of the functional gate structure; and
a first local source/drain contact structure contacting another of the first epitaxial semiconductor regions located on a second side of the functional gate structure opposite the first side, and a second local source/drain contact structure overlying the first local source/drain contact structure and contacting another of the second epitaxial semiconductor regions located on the second side of the functional gate structure, wherein a trench isolation structure is located between the first local source/drain contact structure and the second local source/drain contact structure.

20. A semiconductor structure comprising:
a plurality of vertically stacked and vertically spaced apart semiconductor nanowires located over a substrate, wherein the plurality of vertically stacked and vertically spaced apart semiconductor nanowires are organized into a lower nanowire array and an upper nanowire array;
a functional gate structure straddling over the plurality of vertically stacked and vertically spaced apart semiconductor nanowires, wherein the functional gate structure comprises a functional gate stack having a first portion located above a topmost semiconductor nanowire of the plurality of vertically stacked and vertically spaced apart semiconductor nanowires, and a second portion located beneath each semiconductor nanowires of the plurality of vertically stacked and vertically spaced apart semiconductor nanowires;
first epitaxial semiconductor regions of a first conductivity type laterally contacting end walls of the semiconductor nanowires in the lower nanowire array;
second epitaxial semiconductor regions of a second conductivity type opposite the first conductivity type laterally contacting end walls of the semiconductor nanowires in the upper nanowire array; and
an insulator layer located between the first epitaxial semiconductor region and the second epitaxial semiconductor regions.

* * * * *